(12) United States Patent
Shi et al.

(10) Patent No.: US 6,612,025 B1
(45) Date of Patent: Sep. 2, 2003

(54) METHOD FOR CREATING A CONNECTION WITHIN A MULTILAYER CIRCUIT BOARD ASSEMBLY

(75) Inventors: Zhong-You (Joe) Shi, Ann Arbor, MI (US); Lakhi N. Goenka, Ann Arbor, MI (US); Andrew Z. Glevatsky, Plymouth, MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 0 days.

(21) Appl. No.: 09/656,043

(22) Filed: Sep. 6, 2000

(51) Int. Cl.[7] .................................................. H05K 3/34
(52) U.S. Cl. .............................. 29/840; 29/825; 29/830; 29/842; 29/846; 29/852; 29/853; 174/250; 174/260; 174/262; 174/254; 174/264; 174/266; 228/215; 228/248.1; 438/612
(58) Field of Search .......................... 29/825, 830, 842, 29/844, 846, 852, 853, 840; 174/250, 260, 262, 264, 254, 266; 228/215, 248.1; 438/612

(56) References Cited

U.S. PATENT DOCUMENTS

| 3,801,388 | A |   | 4/1974  | Akiyama et al. |
| 4,404,059 | A |   | 9/1983  | Livshits et al. |
| 5,197,892 | A | * | 3/1993  | Yoshizawa et al. ........... 439/91 |
| 5,317,801 | A | * | 6/1994  | Tanaka et al. ................ 29/830 |
| 5,738,797 | A |   | 4/1998  | Belke, Jr. et al. |
| 5,819,401 | A | * | 10/1998 | Johannes et al. ............. 29/830 |
| 6,087,445 | A | * | 7/2000  | Gherghel et al. ........... 525/178 |
| 6,121,679 | A | * | 9/2000  | Luvara et al. .............. 257/700 |
| 6,218,628 | B1 | * | 4/2001  | Schmidt et al. ............. 174/250 |
| 6,252,001 | B1 | * | 6/2001  | Babb et al. ................. 525/202 |
| 6,262,833 | B1 | * | 7/2001  | Loxley et al. .............. 359/296 |
| 6,307,159 | B1 | * | 10/2001 | Soejima et al. ............. 174/250 |
| 6,310,303 | B1 | * | 10/2001 | Luvara et al. .............. 174/261 |

\* cited by examiner

Primary Examiner—Peter Vo
Assistant Examiner—Paul Kim
(74) Attorney, Agent, or Firm—Visteon Global Tech, Inc.

(57) ABSTRACT

A method for forming connections within a multi-layer electronic circuit board 10. The method includes forming an aperture within the circuit board and selectively coating the interior surface of the aperture with a polar solder mask material that is effective to bond with solder that is selectively inserted into the aperture, thereby retaining the solder within the aperture and improving the electrical connection provided by the solder.

5 Claims, 3 Drawing Sheets

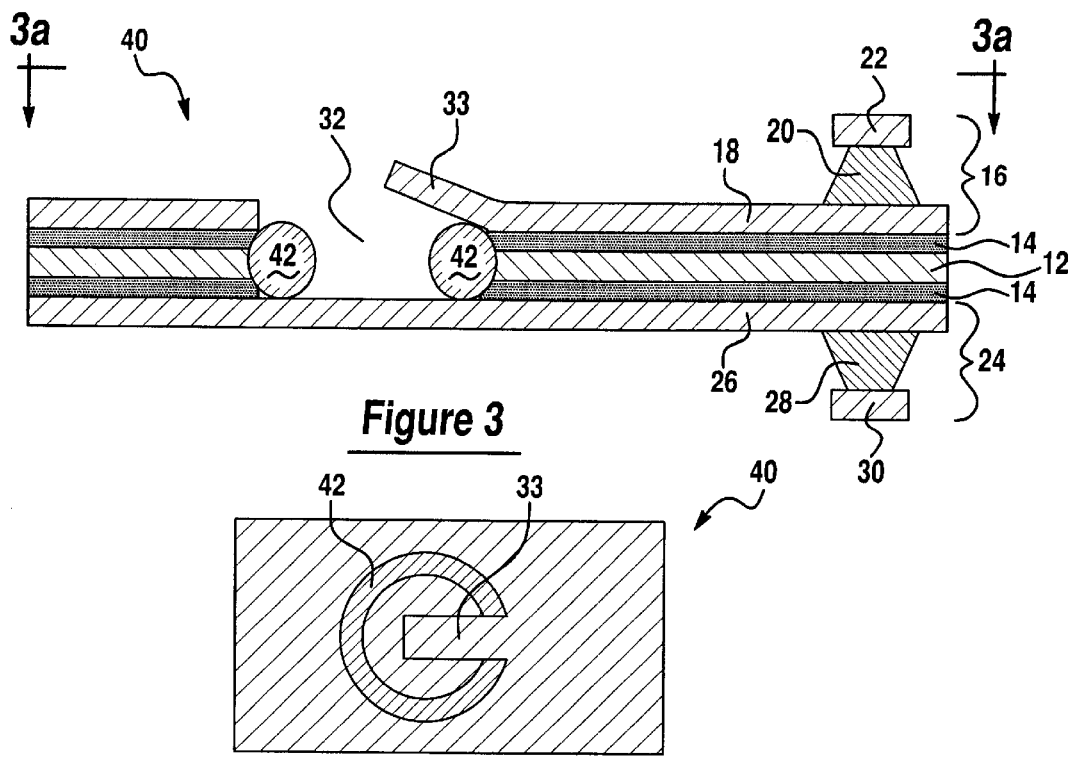
*Figure 3*
*Figure 3a*
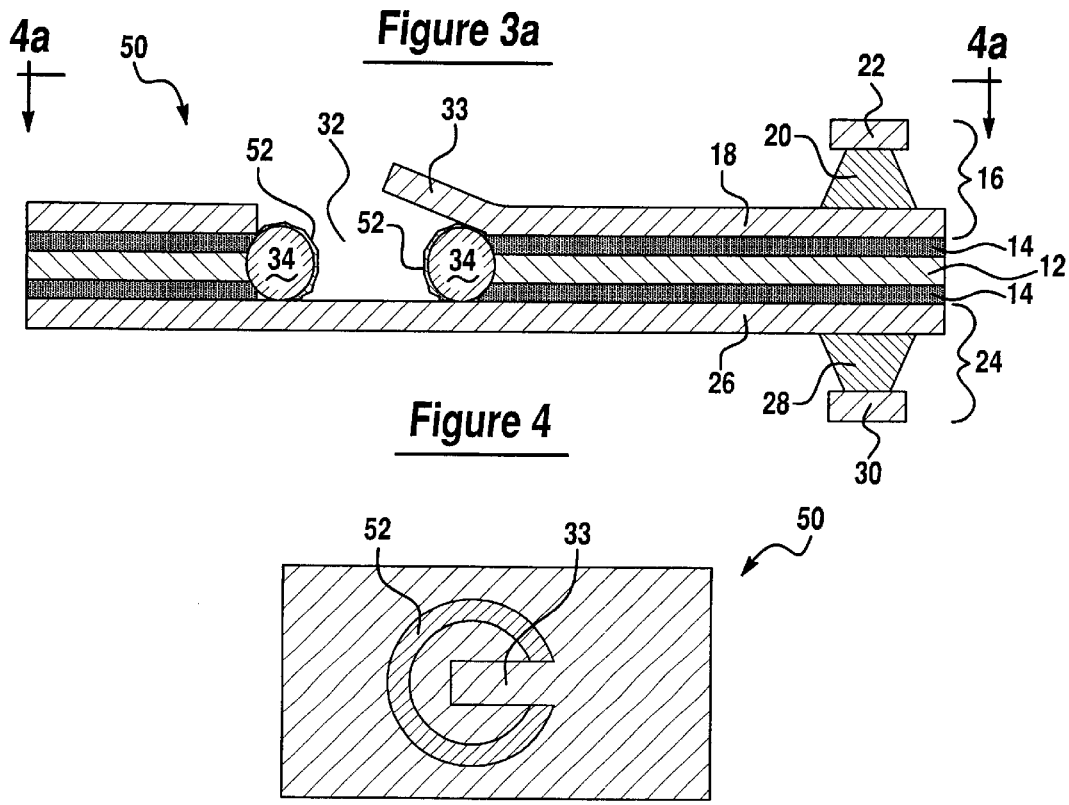
*Figure 4*
*Figure 4a*

METHOD FOR CREATING A CONNECTION WITHIN A MULTILAYER CIRCUIT BOARD ASSEMBLY

FIELD OF THE INVENTION

The present invention relates to a method for making an electrical circuit board and more particularly, to a method for making a multi-layer electrical circuit board having interconnections between portions or layers of the circuit board.

BACKGROUND OF THE INVENTION

Multi-layer circuit boards contain and/or include electrical components which selectively and operatively populate opposed first and second surfaces (i.e., top and bottom surfaces) of each board (or other respective interior portions of each of the boards), thereby desirably allowing each of the electrical circuit boards to contain and/or include a relatively large amount of electrical components which efficiently and densely populate the respective boards.

It is desirable to allow for communication by and between and/or interconnection of the component containing surfaces and/or portions of an electrical circuit board, thereby allowing the contained electrical components on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of various contained components.

This desired interconnection typically requires one or more vias, apertures and/or holes to be drilled, etched and/or formed through the core of the circuit board substrate, thereby selectively creating one or more vias, apertures and/or holes which pass through and/or traverse some or all of the component containing surfaces and/or layers of the circuit board. The vias are then typically filled with a conductive material or solder (e.g., a pin or component connector is soldered into the hole). In this manner, electrical connections are made or formed which connect electrical components and/or circuitry to the core of the circuit board substrate, or to other components and/or circuitry located on the opposing side or surface of the board.

One drawback with these conventional vias is that non-solderable material (i.e., insulating material and/or material which does not substantially bind or metallurgically bond with solder) is often present within these vias, and often prevents the solder or other conductive material from electrically connecting the desired layers of circuitry and/or components together in a consistent and reliable manner. For example and without limitation, the surface tension of the deposited solder or other conductive material and the non-wettable or non-solderable surfaces within these vias often cause and/or allow the solder or other conductive material to be drawn or "sucked" out of the aperture or via in which it is deposited, thereby substantially preventing or reducing the likelihood of the solder material "wetting" or metallurgically bonding to the conducting portions or layers of the circuit board. Hence, these types of arrangements often result in a defective portion or region of the circuit board where some or all layers of the circuit board are not desirably interconnected.

There is therefore a need for a method for producing a multi-layer electrical circuit board which overcomes some or all of the previously delineated drawbacks of prior circuit boards and which includes vias or cavities which provide for improved solder interconnections between one or more layers of electrical circuitry.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the invention to provide a method for producing a multi-layer electrical circuit board which overcomes some or all of the previously delineated drawbacks of prior multi-layer electrical circuit board forming methodologies and techniques and which allows for the selective, efficient, and reliable interconnection between some or all of the various component containing surfaces and portions of the formed multi-layer electrical circuit board.

According to a first aspect of the present invention a method for creating a connection within a multi-layer circuit board is provided. The multi-layer circuit board assembly includes a first electrically conductive member, a second electrically conductive member, and a core layer disposed between the first and second electrically conductive members. The method includes the steps of: selectively removing a portion of the first electrically conductive member and a portion of core member, effective to create an aperture within the circuit board assembly which extends to the second electrically conductive member; providing an amount of solder-mask material having a polar molecular composition; disposing the amount of solder-mask material within the aperture, effective to cover a surface of the core member which surrounds the aperture; and inserting solder material within the aperture, effective to cause the solder material to bond with the first electrically conductive member, the solder-mask material and the second electrically conductive member, thereby creating a relatively reliable connection between the first electrically conductive member and the second electrically conductive member.

These and other objects, aspects, and advantages of the present invention will become apparent upon reading the following detailed description in combination with the accompanying drawings.

BRIEF DESCRIPTION OF THE DRAWINGS

FIG. 3 is a sectional side view of a multi-layer circuit board including an aperture which is utilized to interconnect layers of the circuit board, and which is made in accordance with the teachings of a first embodiment of the present invention;

FIG. 3(a) is a top view of the circuit board illustrated in FIG. 3;

FIG. 4 is a sectional side view of a multi-layer circuit board including an aperture which is utilized to interconnect layers of the circuit board, and which is made in accordance with the teachings of a second embodiment of the present invention;

FIG. 4(a) is a top view of the circuit board illustrated in FIG. 4;

DETAILED DESCRIPTION OF THE PREFERRED EMBODIMENT OF THE INVENTION

Figure 1:
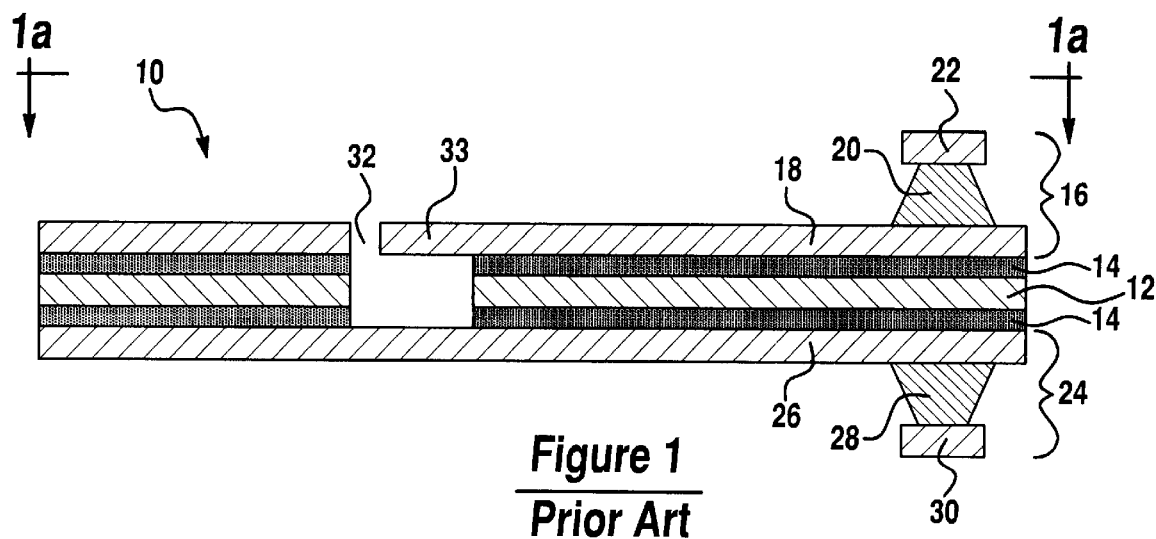
FIG. 1 illustrates a sectional side view of a multi-layer circuit board.

Referring now to FIG. 1, there is shown a prior art circuit assembly 10, which is formed by "building up" or sequentially adding various layers of certain materials to a core or ground member or layer 12 in a conventional manner. Core member 12 is manufactured and/or formed from an electrically conductive material such as copper or a metallic and electrically conductive foil material. A pair of substantially identical layers of insulating material 14 are respectively applied/coupled to and substantially "cover" the "top" and "bottom" surfaces of member 12. Insulating material or layers 14 may include a conventional dielectric or epoxy material and/or an adhesive material.

Circuit assembly 10 further includes a pair of pre-circuit or "etched tri-metal" ("ETM") assemblies 16, 24. Each pre-circuit assembly 16, 24 respectively includes a core metal portion 20, 28 which is preferably manufactured and/or formed from a conventional aluminum material, and a pair of electrically conductive layers 18, 22 and 26, 30 which are respectively attached to the opposing surfaces (e.g., top and bottom surfaces) of core metal portions 20, 28, and which are preferably manufactured and/or formed from a conventional copper material. While copper and aluminum are used to form circuit board 10, it should be appreciated that other metals and metal combinations can be used to form circuit board 10 and all of the other circuit boards described herein and may include metals such as iron, nickel, silver, gold, tin and alloys thereof. Conductive layers 18, 26 of each pre-circuit assembly 16, 24 are coupled/attached to insulating layers 14 in a conventional manner. In one non-limiting embodiment of the invention, pre-circuit assemblies 16, 24 and/or electrically conductive members 18, 26 are connected, coupled, and/or attached to insulating layers 14 by use of a known and conventional laminating process such as a conventional "one-step" laminating process.

It is often desirable to interconnect layers of a multi-layer circuit assembly such as circuit assembly 10. In order to do so, an aperture or via is formed within the circuit assembly by selectively removing portions of various layers of the circuit assembly. For example and without limitation, an aperture 32 has been formed within circuit assembly 10 by selectively removing portions of insulating layers 14, core 12 and member 18 by use of a conventional etching, drilling, punching and/or machining process. In one non-limiting embodiment, aperture 32 is formed by creating apertures in each layer 14, core 12 and member 18 before the layers are cooperatively assembled or coupled together. Aperture 32 is generally circular in shape and extends to or terminates at member 26 (e.g., member 26 is exposed at the bottom of aperture 32). Once aperture 32 has been formed, solder material is inserted into aperture 32 and subsequently liquefied and/or "reflowed", thereby interconnecting conductive layers or members 18 and 26. A portion of layer or member 18 is not removed when aperture 32 is formed, and forms an extension, "tab" or protrusion 33 which extends into aperture 32, and which assists and/or promotes the interconnection between layer 18 and layer 26 when solder material is inserted into the aperture 32.

It is often desirable to "treat" or coat the surface of the ground plane or core layer 12 which surrounds and/or forms a portion of aperture 32 in order to prevent layers or members 16 and 26 from being "grounded" or electrically and physically connected to core 12.

Figure 2:
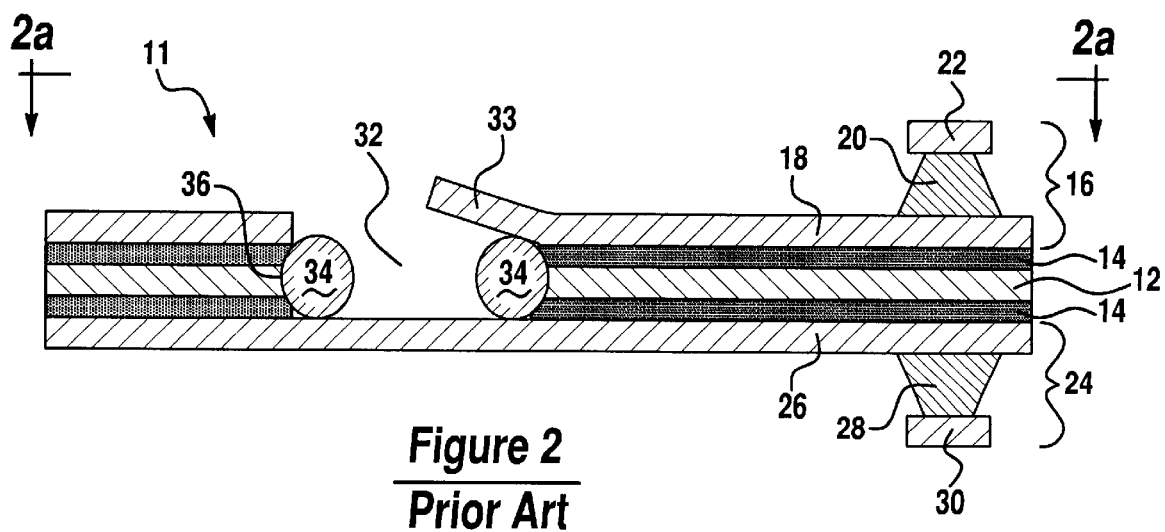
FIG. 2 is a sectional side view of a multi-layer circuit board including an aperture which is utilized to interconnect layers of the circuit board.
Figure 2A:
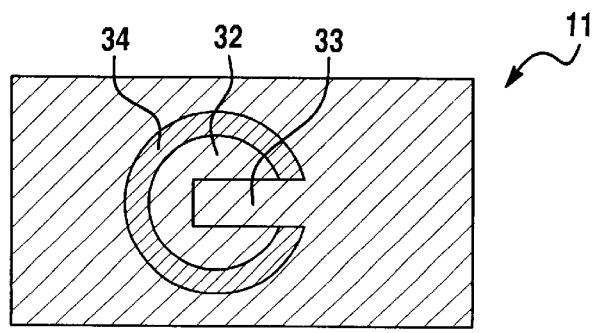
FIG. 2(a) is a top view of the circuit board illustrated in FIG. 2.

One prior art method for preventing member 18 and member 26 from being connected to ground layer or core 12 is shown in circuit assembly 11 which is illustrated in FIGS. 2 and 2(a) and which is substantially identical to circuit assembly 10, with the exception that a material 34 has been added. Particularly, an amount of solder mask material or paint 34 is inserted into aperture 32, and coats or covers the surface 36 of core 12 which "surrounds" or defines a portion of aperture 32. The solder mask material 34 substantially prevents the solder or conductive material which is inserted into aperture 32 from connecting conductive layer or member 18 or member 26 to ground layer or core 12. However, this interconnection arrangement and method may not be perfectly effective as conventional solder mask material 34 is made of a non-polar material which cannot be wetted (e.g., metallurgically bonded) with the solder. Because this conventional solder mask is difficult to wet and/or bond, the surface tension of the liquefied or "reflowed" solder in aperture 32 may cause the solder to be "sucked" or drawn out of aperture 32 before wetting or metallurgically bonding with layer or member 26. Consequently, the solder is substantially prevented from interconnecting member 18 with member 26.

Referring now to FIGS. 3 and 3(a), there is shown a circuit assembly 40 which is formed in accordance with the teachings of a first embodiment of the present invention. Circuit assembly 40 is substantially similar to circuit assembly 11 which is illustrated in FIGS. 2 and 2(a) with the exception that conventional solder mask material 34 has been replaced with polar solder mask material 42. By inserting polar solder mask material 42 into aperture 32 in the place of conventional solder mask material 34, solder material which is inserted into the aperture 32 more reliably and consistently "wets" and/or metallurgically bonds with layer or member 26, thereby forming a more robust and reliable interconnection between layers 18 and 26.

In the preferred embodiment of the invention, polar solder mask material 42 is a substantially and molecularly "polar" polymeric material. In one non-limiting embodiment, the polymeric material includes a relatively high percentage of halogen elements which further increase the "polarity" of the solder mask material and promote and/or increase the "solder-bonding" characteristics of the solder mask material. When solder paste is introduced into aperture 32 and is subsequently liquefied or "reflowed", the solder bonds with solder mask material 42. This "bonding" between the solder and the solder mask material 42 provides a force which opposes or "counteracts" the surface tension of the solder and substantially retains and/or holds the liquefied solder within the aperture 32, thereby allowing the solder to "wet" or bond with layer or member 26 and ensuring a relatively robust and/or reliable interconnection between members 18 and 26. Solder mask material 42 also covers the exposed surfaces of core member 12 (e.g., the surfaces surrounding aperture 32) in a manner substantially similar to material 36, thereby preventing solder from bonding with core 12.

Referring now to FIGS. 4 and 4(a), there is shown a circuit assembly 50 which is formed in accordance with the teaching of a second embodiment of the present invention. Circuit assembly 50 is substantially similar to circuit assembly 11 which is illustrated in FIGS. 2 and 2(a) with the exception that an amount of "wettable" material 52 (e.g., material which is capable of bonding with conventional solder) has been applied/coupled to the surface of solder mask material 34. By coating and/or applying material 52 to material 34, solder material which is inserted into the aperture 32 more reliably and consistently "wets" and/or metallurgically bonds with layer or member 26, thereby forming a more robust and reliable interconnection between layers 18 and 26. The "wettable" material 52 is preferably substantially identical to material 42 in chemical composition (e.g., material 52 is a substantially "polar" polymeric material) and is preferably applied to solder mask material 34 in a conventional manner (e.g., is "painted" on material 34) after the solder mask material 34 is inserted into aperture 32. Material 52 acts in a substantially identical manner to material 42 and provides a bonding force with the molten solder which opposes the surface tension of the molten solder and substantially retains the solder within aperture 32, thereby ensuring a robust connection between member 18 and member 26.

In one non-limiting embodiment, material 52 is applied to the "outer" surface of material 34 and is effective to alter the chemical composition of the outer surface of material 34 in a manner which increases the polarity of the outer surface of material 34. In another non-limiting embodiment, a "surfactant" material is added to the solder paste and is effective to lower the surface tension of the molten solder once the solder is liquefied or "reflowed", thereby further reducing the tendency and/or likelihood of the solder to be drawn or "sucked" out of aperture 32 without bonding to conductive member or layer 26.

Figure 5:
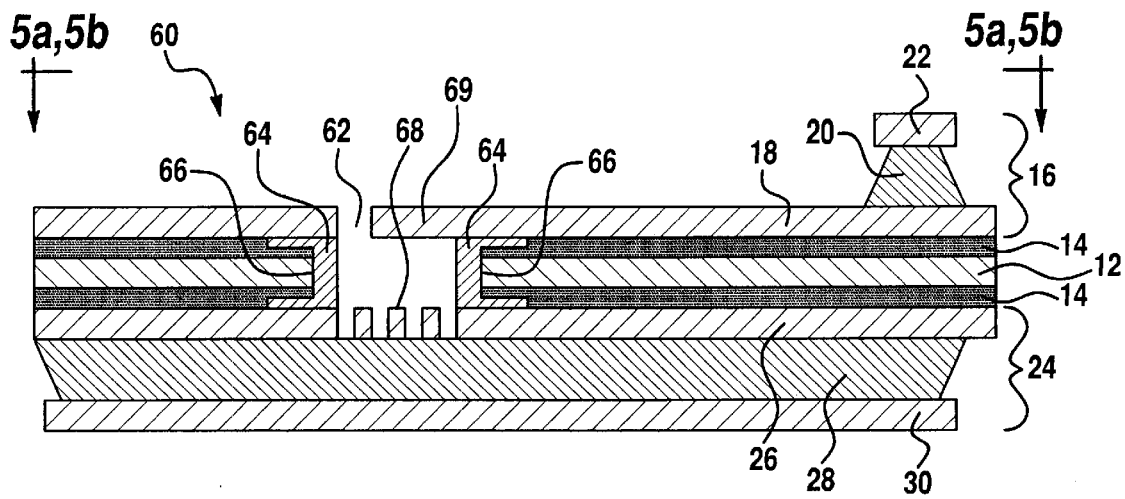
FIG. 5 is a sectional side view of a multi-layer circuit board including an aperture which is utilized to interconnect layers of the circuit board, and which is made in accordance with the teachings of a third embodiment of the present invention.

Referring now to FIGS. 5, there is shown a circuit assembly 60 which is formed in accordance with the teachings of a third embodiment of the present invention. Circuit assembly 60 is substantially identical to circuit assembly 10 which is illustrated in FIG. 1 with the exception that aperture 32 has been replaced with aperture 62. As shown in FIG. 5, an amount of solder mask material 64 has been selectively applied to, and coats and/or covers, the surface 66 of core 12 which "surrounds" or defines a portion of aperture 62. The solder mask material 64 substantially prevents solder material which is inserted into aperture 62 from bonding with surface 66 and physically and/or electrically connecting the conductive layers or members 18, 26 to the ground layer or core 12.

Figure 5A:
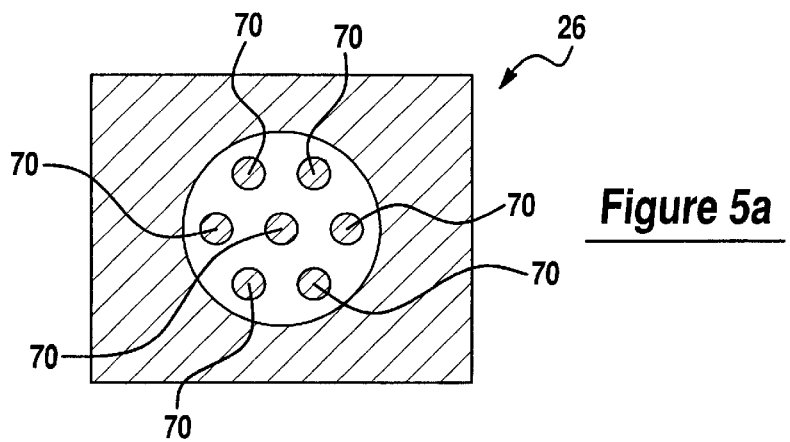
FIG. 5(a) is a top view of a conductive layer of the circuit board illustrated in FIG. 5.
Figure 5B:
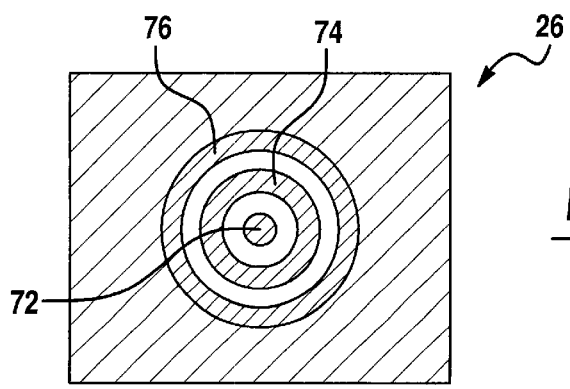
FIG. 5(b) is a top view of an alternate embodiment of a conductive layer used in the circuit board illustrated in FIG. 5.

Additionally,, layer or member 26 has been selectively etched, punched or otherwise machined to have an "irregular" surface (i.e., a surface which is not flat) or surface pattern 68 in the portion or region of member 26 which is exposed and/or resides in aperture 62. In one non-limiting embodiment illustrated in FIG. 5(a), the surface or surface pattern 68 of member 26 includes several generally cylindrical protrusions, members, or portions 70. In another non-limiting embodiment, illustrated in FIG. 5(b), member 26 is etched or otherwise formed to include several substantially concentric annular rings or cylinders 72, 74 and 76. It should be appreciated that by forming and/or creating irregularities within the exposed portion or region of member 26, the amount of "wettable" surface area (i.e., the amount of surface area to which molten solder may bond) of that portion of member 26 which is disposed within aperture 62 is desirably increased. It should further be appreciated that many other types of geometric formations (e.g., rectangular members, triangular members, polygonal members) can be formed within member 26 which will likewise provide a desirable increase in the "wettable" surface area of member 26 which is disposed within aperture 62.

In operation, when molten solder is introduced into aperture 62, the increased and/or additional surface area of member 26 which is present within aperture 62 provides an increased bonding force with the molten solder which opposes the surface tension of the molten solder and substantially retains the solder within aperture 62, thereby ensuring a robust connection between member 18 and member 26. In one non-limiting embodiment, member 18 includes a protrusion or "tab" member 69 which is substantially identical to member 33 of circuit 10 and which provides additional surface area with which the molten solder may bond. In other alternate embodiments, the solder-mask material 64 is substantially identical to solder material 42.

It should be understood that the invention is not limited to the exact embodiment or construction which has been illustrated and described but that various changes may be made without departing from the spirit and the scope of the invention.

What is claimed is:

1. A method for creating a connection within a multi-layer circuit board assembly, said multi-layer circuit board assembly including a first electrically conductive member, a second electrically conductive member, and a core member which is disposed between said first and second electrically conductive members, said method comprising the steps of:

selectively removing a first portion of said first electrically conductive member effective to create an aperture within said circuit board assembly which extends to said second electrically conductive member, wherein said removal of said first portion creates a second portion which extends within said aperture;

selectively removing a portion of said second electrically conductive member effective to form a surface pattern having additional exposed surface area within said aperture;

providing an amount of solder-mask material having a polar molecular composition;

disposing said amount of solder-mask material within said aperture, effective to cover only said core member which is exposed within said aperture; and inserting solder within said aperture, effective to cause said solder material to bond with said second portion, said first electrically conductive member, and with said surface pattern of said electrically conductive member, thereby retaining said solder within said aperture.

2. The method of claim 1 wherein said material comprises a polymeric material.

3. The method of claim 2 wherein said polymeric material includes a halogen.

4. The method of claim 1 wherein said step of selectively removing a portion of said second electrically conductive member effective to form a surface pattern having additional exposed surface area within said aperture further comprises the step of forming at least one cylindrical member within said second electrically conductive member within said aperture.

5. The method of claim 1 wherein said step of selectively removing a portion of said second electrically conductive member effective to form a surface pattern having additional exposed surface area within said aperture further comprises the step of forming a plurality of concentric annular rings within said second electrically conductive member within said aperture.

* * * * *

UNITED STATES PATENT AND TRADEMARK OFFICE
CERTIFICATE OF CORRECTION

PATENT NO. : 6,612,025 B1
DATED : September 2, 2003
INVENTOR(S) : Zhong-You (Joe) Shi, Lakhi N. Goenka and Andrew Z. Glevatsky It is certified that error appears in the above-identified patent and that said Letters Patent is hereby corrected as shown below:

<u>Title page,</u>
Item [75], the name of the inventor "Andrew Z. Glevatsky" is hereby changed to the name of -- Andrew Z. Glovatsky --.

Signed and Sealed this

Thirteenth Day of January, 2004

JON W. DUDAS
*Acting Director of the United States Patent and Trademark Office*